United States Patent
Jia et al.

(10) Patent No.: US 12,085,612 B2
(45) Date of Patent: Sep. 10, 2024

(54) ON-CHIP DEBUGGING DEVICE AND METHOD

(71) Applicant: Suzhou Centec Communications Co., Ltd., Suzhou (CN)

(72) Inventors: Fushan Jia, Suzhou (CN); Rui Jiang, Suzhou (CN); Jicun Zhang, Suzhou (CN)

(73) Assignee: Suzhou Centec Communications Co., Ltd., Suzhou (CN)

( * ) Notice: Subject to any disclaimer, the term of this patent is extended or adjusted under 35 U.S.C. 154(b) by 290 days.

(21) Appl. No.: 17/594,034

(22) PCT Filed: Dec. 2, 2019

(86) PCT No.: PCT/CN2019/122393
§ 371 (c)(1),
(2) Date: Apr. 20, 2022

(87) PCT Pub. No.: WO2020/207040
PCT Pub. Date: Oct. 15, 2020

(65) Prior Publication Data
US 2022/0252665 A1    Aug. 11, 2022

(30) Foreign Application Priority Data

Apr. 11, 2019  (CN) .......................... 201910288054.5

(51) Int. Cl.
*G06F 11/00* (2006.01)
*G01R 31/3185* (2006.01)
(Continued)

(52) U.S. Cl.
CPC . *G01R 31/3187* (2013.01); *G01R 31/318597* (2013.01); *G06F 11/221* (2013.01); *G06F 11/2289* (2013.01); *G06F 11/3089* (2013.01)

(58) Field of Classification Search
CPC .............. G06F 11/221; G06F 11/2289; G06F 11/3089; G01R 31/31705; G01R 31/318597; G01R 31/3187
See application file for complete search history.

(56) References Cited

U.S. PATENT DOCUMENTS 6,397,354 B1 * 5/2002 Ertekin ............... G06F 11/2733
                                                    714/45
7,325,164 B2 * 1/2008 Swanson ........ G01R 31/318522
                                                    714/30
(Continued)

OTHER PUBLICATIONS

English Translation of International Preliminary Report on Patentability, Sep. 28, 2021, pp. 1-6 (Year: 2021).*
(Continued)

*Primary Examiner* — Elmira Mehrmanesh
(74) *Attorney, Agent, or Firm* — Wang Law Firm, Inc.

(57) ABSTRACT

An on-chip debugging device and method is provided. The on-chip debugging device includes: an external interface module configured for outputting chip debugging state information to an external debugger and receiving a control instruction of the external debugger; a debugging mode control module configured for setting a to-be-sampled type of a specified chip internal signal and setting a debugging trigger condition according to the debugging configuration of the external debugger or the internal CPU; a debugging monitor module configured for sampling and recording the internal signal of the chip of the specified type so as to identify the running state of the chip; and a debugging information processing module configured for storing the running state of the chip in an internal debugging memory and sending it to the external debugger by the external interface module or sending it to the internal CPU via an internal bus. The on-chip debugging functions which are relatively simple, occupy less resources and have more
(Continued)

powerful functions can be realized by the device and the method.

2 Claims, 3 Drawing Sheets

(51) Int. Cl.
*G01R 31/3187* (2006.01)
*G06F 11/22* (2006.01)
*G06F 11/30* (2006.01)

(56) References Cited

U.S. PATENT DOCUMENTS

| | | | | |
|---|---|---|---|---|
| 8,635,497 B2 * | 1/2014 | Miller | ............... | G06F 11/364 |
| | | | | 714/45 |
| 10,037,259 B2 * | 7/2018 | Adeeb | ............... | G06F 11/3495 |
| 10,161,999 B1 * | 12/2018 | Nand | ............... | G01R 31/3177 |
| 10,528,448 B2 * | 1/2020 | Mitra | ............... | G06F 11/3466 |
| 11,249,872 B1 * | 2/2022 | Thangavel | ............... | G06F 11/2221 |
| 2006/0242501 A1 * | 10/2006 | Kimelman | ............... | G01R 31/318572 |
| | | | | 714/724 |
| 2008/0184056 A1 * | 7/2008 | Moyer | ............... | G06F 11/3656 |
| | | | | 713/502 |
| 2008/0320247 A1 * | 12/2008 | Morfey | ............... | G06F 9/30032 |
| | | | | 714/E11.053 |
| 2013/0031420 A1 * | 1/2013 | Haverkamp | ............... | G06F 11/3656 |
| | | | | 714/45 |
| 2014/0053026 A1 * | 2/2014 | Zhong | ............... | G06F 11/25 |
| | | | | 714/39 |
| 2014/0053035 A1 * | 2/2014 | Harper | ............... | G01R 31/3177 |
| | | | | 714/733 |
| 2014/0075255 A1 * | 3/2014 | Lee | ............... | G01R 31/31705 |
| | | | | 714/727 |
| 2015/0227410 A1 * | 8/2015 | Jarrett | ............... | G01R 31/31705 |
| | | | | 714/45 |
| 2015/0278418 A1 * | 10/2015 | Kodavalla | ............... | G06F 30/34 |
| | | | | 716/117 |
| 2018/0164371 A1 * | 6/2018 | Morris | ............... | G01R 31/31721 |
| 2019/0302180 A1 * | 10/2019 | Woo | ............... | G06F 11/3089 |

OTHER PUBLICATIONS

English Translation of First Office Action CN201910288054, Feb. 2, 2021, pp. 1-10 (Year: 2021).*

* cited by examiner

ON-CHIP DEBUGGING DEVICE AND METHOD

TECHNICAL FIELD

The invention relates to chip debugging technology, in particular to an on-chip debugging device and method.

BACKGROUND ART

With the development of information technology, the design of integrated circuit chips becomes more and more complicated. The area of each chip is increased, more and more logic is integrated, and functions are more and more complex, so that higher requirements are put on chip verification. Pre-verification of the chip in the design process, including simulation verification and prototype verification, has been difficult to fully ensure the correctness of the chip. In addition, there are a variety of configurations and operating modes in the use of the chip, and any carelessness may cause unpredictable consequences. Therefore, debugging on real chips becomes increasingly important. The efficiency of on-chip debugging also greatly influences the stability of the chip and the popularization in the market. Because the chip is already a cured hardware circuit logic, it is the most important factor to determine the efficiency of on-chip debugging whether the chip is designed to provide sufficient observability and scalability.

The current on-chip debugging methods are mainly divided into the following: first, the debugging is performed based on an on-chip boundary scan testing standard (the Joint Test Action Group, JTAG) interface; second, special debugging logic and a debugging interface are added, and the running state of the chip is recorded and provided for a debugger to access; and third, a pure debugging method is provided for adding input and output interfaces and integrating a debugging monitor module on a chip.

(1) Existing Debugging Method I

A JTAG interface is designed for a general chip design, and can be used for a boundary scan test after chip production. The on-chip debugging function can be realized by adding some auxiliary logic on the JTAG interface. The structure is substantially as shown in FIG. 1. The existing CPU design architecture basically comprises an on-chip debugging functional module of the technical solution. If a problem occurs during chip testing and use, a dedicated CPU external debugger can be connected to debug it. Because the functions of the CPU are relatively determined and widely used, the on-chip debugging of the CPU by the JTAG interface has relatively perfect solutions, such as real-time monitoring of the CPU, breakpoint debugging, single-step debugging and the like.

Reference is made to the on-chip debugging and diagnosis method, device and chip of Patent Document 1 (publicaition number CN106324476A), and the implementation of the multi-core processor EJTAG debuggeable device and system of Patent Document 2 (publication number CN101710300B). In these documens, the debugging method is based on the JTAG interface.

The above technology is mature in CPU debugging, but the technology is also limited to the general chip of CPU, and different external debuggers need to be connected to different CPUs. The above techniques are difficult to implement for on-chip debugging of dedicated chips, and no external debugger is currently available to analyze the input/output information of the JTAG interface.

(2) Existing Debugging Method II

Its main working mode is to add special debugging logic and an external interface, monitor and record chip running status, and output it to the external debugger. According to the designed external interface, the external debugger can be connected with devices such as a PC, an oscilloscope, a logic analyzer and the like. The schematic structure of this method is shown in FIG. 2.

The doucument CN107066707A dislcoses a debuggable design of tracing method and apparatus using snapshots and doucument CN104536859A disclsoes a probe apparatus of an on-chip debugging system. Both documents are based on the technology of FIG. 2. The technical implementation in document CN107066707A is that a debugging module monitors and records the running state of a chip, records it into an internal snapshot buffer or a trace buffer, and outputs it to an external debugger via a debugging interface. The improvement of the solution is that a signal to be observed and the capacity of an internal memory can be selected; an initial state of the signal to be observed can be recorded in a snapshot mode; the signal to be observed can be tracked; and the above information can be output, and the internal state of the chip can recorded as much as possible by subsequent analysis. The technical implementation in Patent Document CN104536859A proposes an on-chip debugging system with wide applicability. The improvement of the technology is that the external debugger can select the signal to be observed; and the internal control logic may feedback chip state information based on commands from the external debugger.

The functions realized by the above technologies are that the external debugger can flexibly select signals to be observed in the chip and return the internal state of the chip as required. The technical solutions above can be used for performing processing with less observation data and shorter observation time. Although the technical solution in Patent Document CN107066707A contains a trigger control function, it can only start tracking data after the trigger condition is met. When an error occurs in the running process of a general chip and debugging is required, the trigger condition which can be set is the moment after the error occurs, so the tracked data in this case can only be the data after the error occurs. However, the data really needed for debugging should be the data before the error occurrs. Especially when an error occurs during the long-term operation of the chip, it is difficult to analyze the cause of the error if the debugging method of Patent Document CN107066707A is followed. The technical solution of Patent Document CN107066707A also provides the function of tracking data for external output. However, since the tracked data in this technical solution is unconditionally tracked after the trigger condition satisfies the start, there is no special distinction between valid information for debugging, the amount of sampled data is large, and the requirement on the performance of the output interface is high, which is not conducive to the specific hardware design of the technology.

(3) Existing Debugging Method III

As shown in FIG. 3, the whole debugging functional module comprises a debugging input module, a debugging output module and an on-chip debugging control module. They are connected to an external debugger, which can generate test vectors to test or debug the chip. Meanwhile, the debugging control module on the chip is used for monitoring the operation of the chip. Reference made to Patent document CN107193705A, a chip debugging method and device) is a specific implementation thereof. In this document, the on-chip debugging control module is mainly used for standby debugging. When the chip to be debugged is suspended (no longer normally running), the standby module can be started for debugging to control the debugging process.

Most of the three technical solutions are used for chip testing. Namely, external input test vectors are used for checking the output of the chip to be debugged to judge whether the function of the chip is normal. In the normal running process of the chip, only data required by normal operation, instead of test vectors, can be input by the external interface, so that the debugging control module cannot judge whether the current chip function is normal. In addition, the specific implementation in Reference document CN107193705A only provides a debugging control method after the chip is suspended. When an error occurs in the normal operation of the chip, an on-line design is needed, and the solution is helpless and cannot be used for any auxiliary debugging.

SUMMARY OF THE INVENTION

The technical problem to be solved by the embodiment of the invention is how to realize on-chip debugging functions which are relatively simple, occupy less resources and have more powerful functions.

In order to solve the technical problem, an embodiment of the invention is as follows.

An on-chip debugging device comprises an external interface module configured for outputting chip debugging state information to an external debugger and receiving a control instruction of the external debugger; a debugging mode control module configured for setting a to-be-sampled type of a specified chip internal signal and setting a debugging trigger condition according to the debugging configuration of the external debugger or the internal CPU; a debugging monitor module configured for sampling and recording the internal signal of the chip of the specified type so as to identify the running state of the chip; and a debugging information processing module configured for storing the running state of the chip in an internal debugging memory and sending it to the external debugger by the external interface module or sending it to the internal CPU via an internal bus.

In a prferred embodiment, the internal debugging memory comprises a rapid memory and a slow memory; and the debugging information processing module performs burst data storage by the rapid memory and ordinary and large data storage by the slow memory.

In a preferred embodiment, the debugging trigger condition comprises a trigger condition for starting a sampling; a trigger condition for ending the sampling; a trigger condition for adjusting the debugging; and a trigger condition for stopping storage of a sampling signal to the internal debugging memory.

In a preferred embodiment, the trigger condition for adjusting the debugging comprises a chip running state error; wherein the adjusting the debugging comprises stopping sampling the chip running state information immediately or after waiting for preset time, and marking current sampled state information as last state information by a preset identifier when the chip running state information is written into the internal debugging memory.

In a preferred embodiment, the debugging monitor module records a changed state and time information when a state change occurs in the internal signal of the chip of the specified type.

The invention also provides an on-chip debugging method comprising the steps of: determining a sampling type and a debugging trigger condition according to the configuration of an external debugger or a chip to be debugged; starting a debugging function, sampling and recording the internal signal of the chip of the specified type, and further identifying the running state of the chip; and monitoring each trigger condition in the debugging process, and executing corresponding adjustment and debugging after the trigger condition is met.

In a preferred embodiment, the on-chip debugging method further comprises modifying the running mode of the chip according to the debugging configuration of the external debugger or the internal CPU when a preset situation occurs in the chip running process.

In a preferred embodiment, the preset situation comprises an error occurring in the chip running, wherein the modifying the running mode of the chip comprises pausing the operation of the chip functional module so as to keep the state when an error occurs, and outputting, by an internal bus interface, a control signal for pausing the operation of the corresponding functional module.

In a preferred embodiment, the trigger condition comprises a chip running state error; wherein the adjusting the debugging comprises stopping sampling the chip running state information immediately or after waiting for preset time, and marking current sampled state information as last state information by a preset identifier when the chip running state information is written into the internal debugging memory.

In a preferred embodiment, the trigger condition comprises a state change of an internal signal of a chip of a specified type; and the executing corresponding adjustment and debugging comprises recording a state after the internal signal of the chip of the specified type changes and time information when the internal signal of the chip changes.

According to the invention, the embedded on-chip debugging device and the corresponding external interface module are added during the design of the integrated circuit, the collection, arrangement and storage of debugging information are realized in the debugging function module, and the functions of outputting the debugging information and controlling command input by the external debugger are realized in the external interface module. Compared with other technologies, the debugging method of the prsent invention is relatively simple to implement, less in occupied resources and more powerful in function. The state of the signal to be observed can be recorded and the chip ruining can be debugged under the condition that the normal running of the chip is not influenced. Also, the internal logic processing of the chip can be paused and then the state inspection and debugging diagnosis are performed on the chip, under the condition that certain specified conditions are met. The invention provides great flexibility for debugging the chip, and facilitates engineers to quickly find and solve the problems of the chip.

DETAILED DESCRIPTION OF THE INVENTION

According to the existing on-chip debugging method, it is common to have the problems of large limitation, difficulty in error reason analysis, inflexibility in sampling data and incapability of judging whether the chip function is normal. For the problems in the prior art, the embodiment of the invention provides an on-chip debugging device. The state of the signal to be observed can be recorded and the chip running can be debugged under the condition that the normal running of the chip is not influenced. Also, the internal logic processing of the chip can be paused and then the state inspection and debugging diagnosis are performed on the chip, under the condition that certain specified conditions are met.

Embodiment 1

Figure 1:
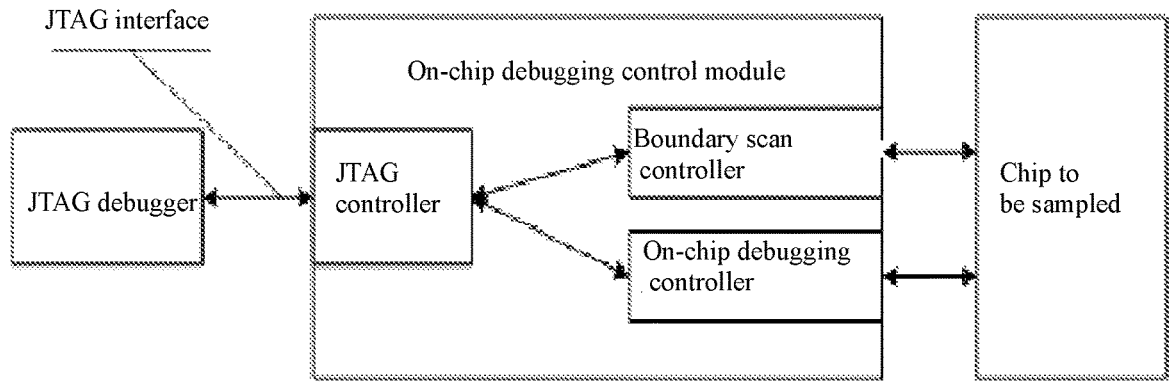
FIG. 1 is a schematic diagram of an on-chip debugging system according to a prior art.
Figure 2:
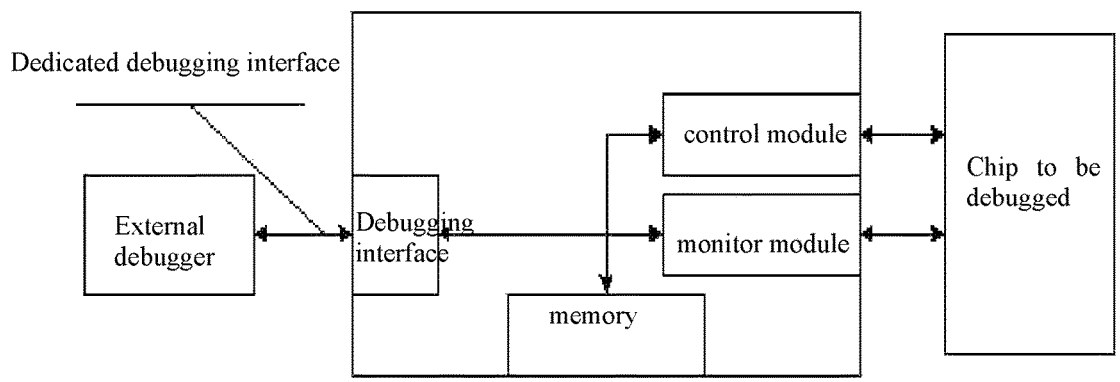
FIG. 2 is a schematic diagram of an on-chip debugging system according to another prior art.
Figure 3:
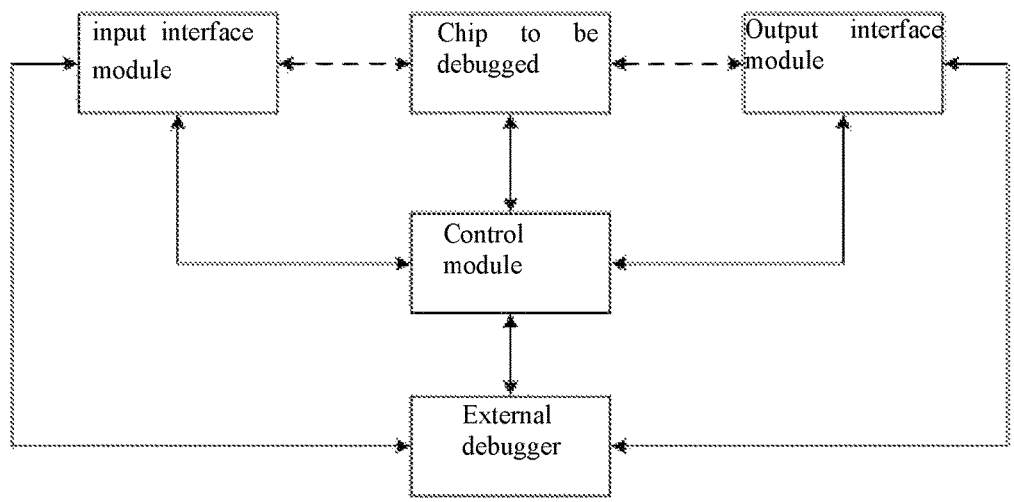
FIG. 3 is a schematic diagram of an on-chip debugging system according to another prior art.
Figure 4:
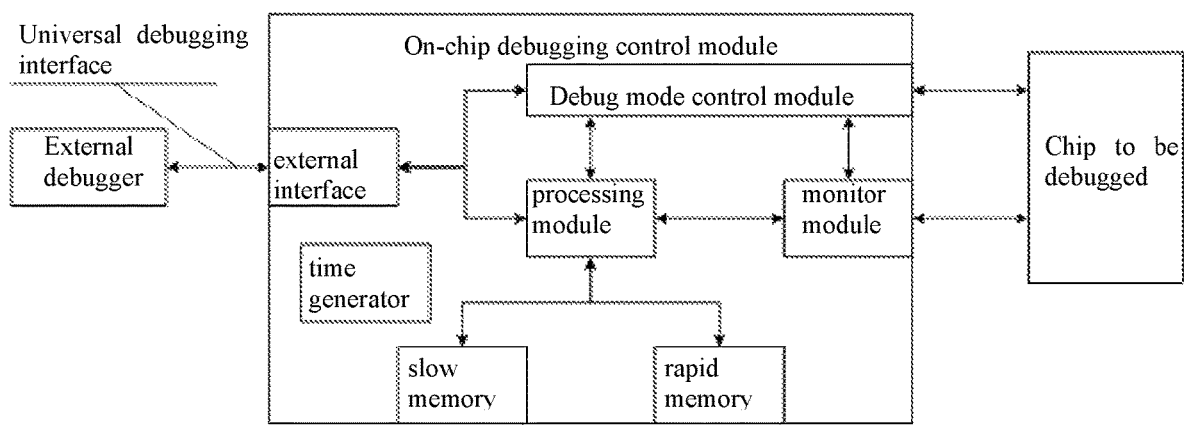
FIG. 4 is a schematic diagram of an on-chip debugging device according to an embodiment of the present invention.

The general structure of the debugging device of the present invention is shown in FIG. 4. An on-chip debugging control module is added to the chip to be debugged. This module mainly includes several major parts: an external interface module, a debugging mode control module, a debugging information processing module, a debugging monitor module, a time generator, two debugging memories, a relatively small rapid memory and a relatively large slow memory. The external interface module is configured for outputting chip debugging state information to an external debugger and receiving a control instruction of the external debugger. The debugging mode control module is configured for setting a to-be-sampled type of a specified chip internal signal and setting a debugging trigger condition according to the debugging configuration of the external debugger or the internal CPU. The debugging monitor module is configured for sampling and recording the internal signal of the chip of the specified type so as to identify the miming state of the chip; and the debugging information processing module is configured for storing the running state of the chip in an internal debugging memory and sending it to the external debugger by the external interface module or sending it to the internal CPU via an internal bus.

The external interface module is in charge of connection with the external debugger during the on-chip debugging, which comprises the steps of receiving a control command of the external debugger, outputting chip debugging state information, and taking over an internal bus of the chip to be debugged by the debugging mode control module when the CPU on the chip to be debugged is suspended.

The interface of the external interface module and the external debugger can adopt a general interface protocol, such as I2C, SPI, PCI/PCIe and the like. The specific interface protocol can be selected according to the requirements of the chip to be debugged. If a high-performance debugging interface is needed, a high-performance interface protocol such as PCIe and the like can be adopted, but the interface generally increases chip design cost; if a low-cost solution is desired, a simple interface protocol such as SPI/I2C can be used, and the signals of such an interface can be multiplexed with a common pin script of the chip, which is used as a debug pin when the debugging function is started, and used as a common pin at other times. Because the above interface protocols are all common interface protocols, the design difficulty is small, and it is easy to implement the external debugger.

When a control unit such as a CPU and the like in the chip to be debugged is suspended, the external debugger can take over the internal bus of the chip by the external interface module and the debugging mode control module so as to realize the function of directly controlling the whole chip to be debugged by means of the external debugger.

The external interface module can also be connected with an external memory, and the chip miming state information sampled by the on-chip debugging module is stored in the external memory. In general, the external memory can be made larger, and this connection provides great flexibility in cases where more data needs to be stored.

The debugging mode control module is used for controlling various working modes during on-chip debugging. It receives configuration information of control devices such as an external debugger or a chip internal CPU, and determines how the debugging function works according to the information.

The main functions of the debugging mode control module are as follows. First, the chip internal signals are selected for sampling according to the configuration so as to mark the running state of the chip. Since storing the sampled results requires the use of debugging memory resources, the more signals are sampled, the more resources are used. Where the memory size is relatively fixed, the fewer the signals sampled are, the longer the recordable chip running state time is. If all the signals which can be sampled on the chip to be debugged and mark the running state of the chip are A, B, C and D, all the signals do not need to be sampled at the same time when the chip is debugged once. At this time, the debugging configuration information can be modified by the module, and only a part of signals related to the debugging can be selected for sampling (such as only sampling signals A and B).

Second, the debugging trigger conditions can be set. The debugging trigger conditions can be various, including a trigger condition for controlling a start of signal sampling, a trigger condition for ending the signal sampling, a trigger condition for adjusting the debugging working mode after the chip running state is in error, and the like. Since the process of debugging does not necessarily sample the signal from the start of the chip, the start trigger condition may be set to control the sampling start time. If the sampling is started when the signal A inside the signal chip changes, the change of the signal A can be used as a trigger condition. Furthermore, by combining the time generator of the on-chip debugging module, it can be specified that the running state information of the chip can be sampled how long after the change of the A signal starts, and the debugging flexibility is better improved. The trigger condition for ending may also have similar processing. When the chip is debugged, the chip running mode may need to be adjusted after a certain condition is met so as to facilitate debugging. If some internal errors may need to be ignored in the chip debugging, a trigger condition can be set. Once the errors occur, the errors can be forcibly repaired by the debugging mode control module so as to allow the chip to continue normal operation. In addition, when storing the sampled data, it is also possible to set when to stop storing new debugging log information to a memory by a trigger condition. After the debugging function is started, sampling and storing the internal running state information of the chip can be started at the same time. If the trigger condition B is met, the storage of new information needs to be stopped, and in this way, the information stored in the memory is guaranteed to be in the state before the trigger condition B occurs. If the clock generator in the debugging controller is combined, and when the trigger condition B occurs, the chip running state information at the designated time is sampled and stored, the function that the chip running state information is stored in the time period before and after the condition B occurs can be realized.

The debugging monitor module samples and records specified signals in the chip to be debugged according to the requirements of the debugging mode control module so as to mark the running state of the chip. When the module records the state information, the module records the state of the selected signal to be sampled only when the selected signal changes, and records the time information when the selected signal changes. Although signal changes in a digital integrated circuit are triggered based on corresponding clock signals, usually these signals do not change during every clock cycle. Therefore, when the signals are sampled, based on its clock and recording the corresponding signal state when the signal changes, the amount of information of the signal state to be stored can be greatly reduced, and subsequent storage or output processing can be facilitated. When the signals A, B and C are sampled, the time of change of the signals A, B and C is T1, T2 and T3 respectively. Only the states of the signals at the three time moments and the time of change of the signals need to be recorded, and it does not need to record the states of the signals at all times from T1 to T3 during each clock cycle. When the signals are analyzed, the time sequence relation of the signals which are changed can be recovered by combining the time information in recording. The state of the three signals need not be recorded at any time.

Furthermore, the above time signals only require relative time information which needs not to be very accurate and is even represented by a common counter implemented on the basis of a clock signal inside the chip. Therefore, the implementation of the above clock generator is also relatively simple. The information sampled by the module can be sent to a debugging information processing module, stored in an internal debugging memory as required, and output to an external debugger by an external interface or output to a control device such as a CPU and the like in the chip via an internal bus.

The debugging information processing module receives the state information sampled by the monitor module, arranges, stores and outputs the state information. The state information change of the chip to be debugged is nonuniform, a large amount of data can be generated in a burst mode in a short time, and only a small amount of data can be generated in most of the time. When the information processing module stores the sampled state information, the two situations above must be considered in order to ensure the integrity of the data. Burst data requires fast storage. However, its overall amount of data is small. Because the rapid memory generally occupies more chip area than the ordinary slow memory, the debugging memory in the invention is divided into two blocks, one block is a rapid memory with smaller capacity and is used for solving the storage problem of burst data. The other block is a slow memory with larger capacity for normal storage functions. The above design achieves a balance of storage performance and capacity. When a burst large-data-volume storage request is received, the data is firstly written into a rapid memory. When burst data is not stored at ordinary times, all data can be sorted out and written into the slow memory with larger capacity according to the sequence of sampling time. In addition, according to the configuration of the external debugger, the debugging information processing module can also output the received state information for analysis to a control device such as a CPU and the like inside the external debugger or the chip by the external interface module and the internal bus interface according to a predefined format. As long as the external interface module and the internal bus interface can provide sufficient data transmission performance, the state information sampled by the on-chip debugging can be completely output. In this case, the size of the chip debugging memory may be reduced, and even no internal debugging memory may be needed to further reduce the cost of the chip. In fact, during the state information sampling, the state information is sampled only when the signal changes, and the sampled state information quantity is reduced to the maximum extent. Therefore, the requirement on the data transmission performance of the two interfaces is relatively low.

The clock generator and the debugging memory in the on-chip debugging module are mainly matched with the processing of the above functional modules, the debugging requirements can be met by adopting a common chip design, and the design complexity is low.

Embodiment 2

Figure 5:
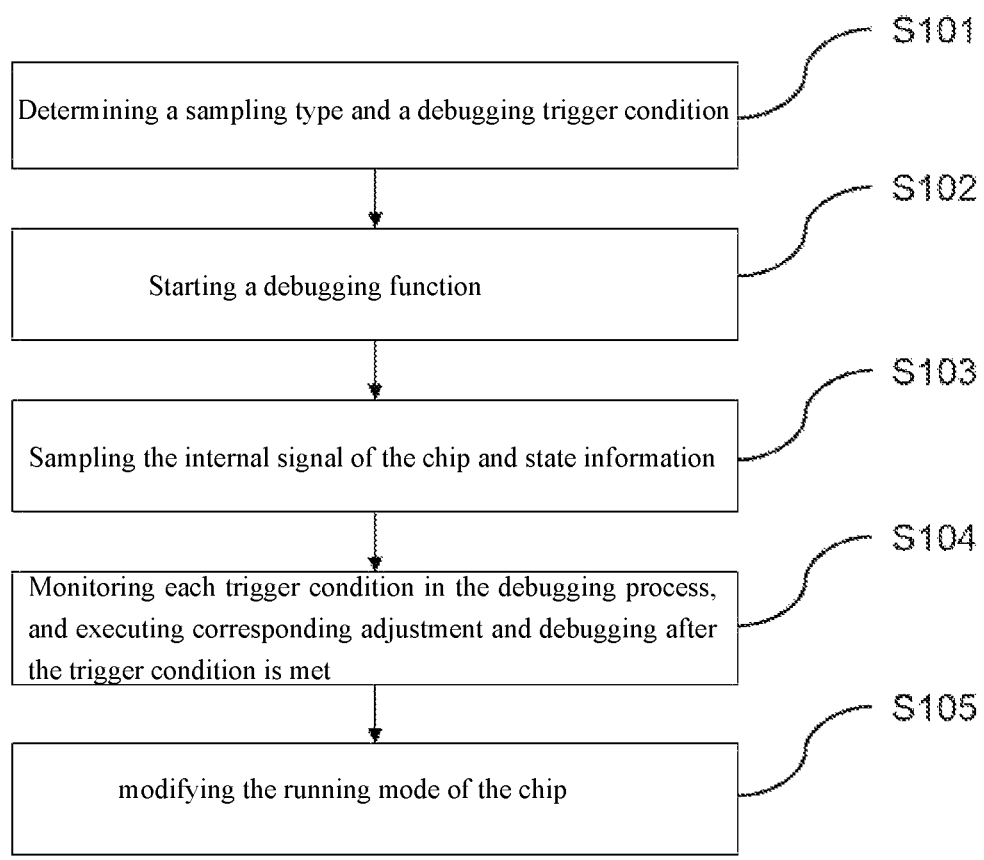
FIG. 5 is a flowchart of an on-chip debugging method according to an embodiment of the present invention.

The embodiment of the invention also discloses an on-chip debugging method. As shown in FIG. 5, the on-chip debugging method comprises:

Step S101, determining a sampling type and a debugging trigger condition according to the configuration of an external debugger or a chip to be debugged.

The configuration of the working mode of an on-chip debugging functional module by an on-chip CPU of an external debugger or a chip to be debugged includes specifying an internal signal of a chip to be sampled, setting the size of an internal fast and a slow memory of an on-chip debugging module, setting a condition for starting an on-chip debugging function, setting a condition for ending the on-chip debugging function, setting a format of debugging state information stored in the internal memory, setting a format of the debugging state information to be output, and setting a trigger condition to meet subsequent working modes of the debugging module and the chip to be debugged. The internal signals of the chip to be sampled are mainly key registers for marking the operation of the chip, and the signals are output to the on-chip debugging module according to the specific design of the system. It is also possible to choose to sample all of these signals or only some of them at the time of specific debugging. The more signals sampled, the more easily it is to debug the chip problem. However, a larger memory capacity is required. Also, a higher-performance external interface is required if these sampled data are to be output. The on-chip debugging function may start at any time or may set a trigger condition for its startup, as desired. The starting time can be set for the problem which is determined and easy to reproduce, so that the data quantity of state information sampling is reduced, and it is convenient to analyze the problem. The on-chip debugging function can be started at any time for the problem which is not easy to reproduce or the condition that the running state of the chip needs to be monitored for a long time. When a problem occurs in the chip, the on-chip debugging module can be actively stopped from sampling the chip state information, and a trigger condition can be set to determine how long to stop sampling after the problem occurs. The state information sampled after the problem may also help analyze the cause of the problem.

Step S102, starting the debugging function.eeeeee

If the starting trigger condition is set, the on-chip debugging module needs to wait for the condition satisfied and start sampling the state information on the chip to be debugged. If the above condition is not set, it is considered by default that the function of sampling information is started immediately.

Step S103, starting a debugging function, sampling and recording the internal signal of the chip of the specified type, and further identifying the running state of the chip.

The on-chip debugging module samples a specified chip state signal, records the state of the signal when the on-chip debugging module changes, records current time information, and writes the current time information into a memory. The on-chip debug module controls that these state information is written to the rapid memory or the slow memory. If the sampled state information quantity is small and the slow memory can meet the storage performance requirement, the sampled state information is directly written into the slow memory. Otherwise, the sampled state information is firstly temporarily stored into the rapid memory, and then the sampled state information is transfered into the slow memory at a proper time. This process not only guarantees the integrity of sampled data in burst, but also guarantees the requirement of large data storage for a long time. If the sampled state information needs to be output to a control device such as an external debugger or a CPU inside the chip, the state information is arranged by the on-chip debugger according to a predefined data format and sent out by an external interface module or an on-chip bus.

Step S104, monitoring each trigger condition in the debugging process, and executing corresponding adjustment and debugging after the trigger condition is met.

This process starts immediately after the debugging function is started. It monitors whether the trigger condition is met while the chip state information is sampled. If a certain trigger condition is detected to be met, corresponding subsequent processing is determined according to the configuration of the mode control, which can generate an interrupt message and the like to an external debugger or an internal CPU module, pause sampling, modify the running state of certain chips and the like. For example, when a chip running error is detected, the sampling of the chip running state information may be stopped immediately or after waiting a certain amount of time.

Meanwhile, when the chip running state information is written into the memory, the last state information, which is currently sampled, is marked with a specific data. As the debugging memory size on the chip is fixed, a full write condition may occur. New state information will typically continue to be written and the previous data will be cyclically overwritten. Therefore, the debugging master control device (such as an external debugger or a CPU in the chip) cannot judge the position of the start and the end of data therein. Certain specific data is written into the debugging memory when the last write operation occurs before writing into the memory is stopped, and the current last piece of information can be marked, so that the debugging master control device can judge the position of the start and the end of the state information stored in the debugging master control device.

Step S105, modifying the running mode of the chip.

If the running state of the chip needs to be changed when certain conditions are met during the chip debugging, the trigger conditions can be set as required, and the running mode of the chip is modified by the internal bus interface when the conditions are met. If an error occurs in the running process of the chip, the operation of some functional modules of the chip may be paused, so that the state of the functional modules in the error is kept, which is convenient for the debugging. At this time, the corresponding trigger condition can be set. After the trigger condition is met, the on-chip debugging module outputs a control signal for pausing the operation of the corresponding functional module by the internal bus interface. Since the running of the digital integrated circuit chip is triggered on the basis of an internal clock, the operation of the corresponding module can be paused by simply turning off the clock input of the corresponding module. However, there is a need to ensure that the debugging master control device can still access a state register within the module via the internal bus.

If the chip running mode needs to be modified, corresponding chip running state control signals are configured as in the above example. Otherwise, the debugging test is continuously performed until the debugging is finished; and an instruction is received for pausing the state information collection, and it waits for restarting the debugging function.

Those of ordinary skill in the art will appreciate that all or part of the steps in the various methods of the embodiments described above may be performed by a program that may be stored in a computer-readable storage medium to instruct the associated hardware for implementation, and the storage medium may include ROM, RAM, magnetic or optical disk, etc.

Although the present invention has been described above, the present invention is not limited thereto. Any person skilled in the art can make various changes and modifications without departing from the spirit and scope of the invention, and therefore the scope of the invention should be determined by the scope of the claims.

What is claimed is:

1. An on-chip debugging method, comprising the steps of:
determining a sampling type and a debugging trigger condition according to a configuration of an external debugger or a chip to be debugged;
starting a debugging operation, sampling and recording an internal signal of the chip of a specified type, and further identifying a running state of the chip;
monitoring each trigger condition in a debugging process, and executing corresponding adjustment and debugging after the trigger condition is met; and
modifying a running mode of the chip according to a debugging configuration of the external debugger or an internal CPU (Central Processing Unit) when a preset situation occurs in a chip running process;
wherein the preset situation comprises an error occurring in the chip running process; and
wherein the step of modifying the running mode of the chip comprises: pausing an operation of a chip functional module so as to keep the running state when an error occurs, and outputting, by an internal bus interface, a control signal for pausing the operation of a corresponding functional module;
wherein the trigger condition comprises a chip running state error;
wherein the adjustment and debugging comprises stopping sampling the chip running state information immediately or after waiting for preset time, and marking current sampled running state information as last running state information by a preset identifier when the chip running state information is written into an internal debugging memory.

2. The on-chip debugging method according to claim 1, wherein the trigger condition comprises a state change of an internal signal of a chip of a specified type; and
    wherein the executing corresponding adjustment and debugging comprises recording a running state after the internal signal of the chip of the specified type changes and time information when the internal signal of the chip changes.

* * * * *